(12) United States Patent
Levi et al.

(10) Patent No.: US 11,588,492 B2
(45) Date of Patent: Feb. 21, 2023

(54) ANALOG TO DIGITAL CONVERTER AND A METHOD FOR ANALOG TO DIGITAL CONVERSION

(71) Applicant: Apple Inc., Cupertino, CA (US)

(72) Inventors: Andrei Levi, Herzliya (IL); Tiberiu Carol Galambos, Binyamina (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/872,055

(22) Filed: Jul. 25, 2022

(65) Prior Publication Data
US 2022/0360273 A1    Nov. 10, 2022

Related U.S. Application Data

(63) Continuation of application No. 17/302,588, filed on May 6, 2021.

(51) Int. Cl.
*H03M 1/06*  (2006.01)
*H03M 1/10*  (2006.01)

(52) U.S. Cl.
CPC ........ *H03M 1/0617* (2013.01); *H03M 1/1009* (2013.01)

(58) Field of Classification Search
CPC ............................ H03M 1/0617; H03M 1/009
USPC .......... 341/118, 120, 155, 166, 143
See application file for complete search history.

(56) References Cited

U.S. PATENT DOCUMENTS

| | | |
|---|---|---|
| 4,550,307 A | 10/1985 | Akashi et al. |
| 4,882,120 A | 11/1989 | Roe et al. |
| 5,790,063 A | 8/1998 | Koifman et al. |
| 5,889,482 A | 3/1999 | Zarubinsky et al. |
| 5,905,406 A | 5/1999 | Sugden et al. |
| 6,157,671 A | 12/2000 | Young |
| 6,181,266 B1 | 1/2001 | Toki |
| 6,850,177 B2 | 2/2005 | Donovan et al. |
| 6,900,994 B2 | 5/2005 | Asayama |
| 7,227,476 B1 | 6/2007 | Wong |
| 7,382,301 B2 | 6/2008 | Mourrier |
| 7,554,372 B1 | 6/2009 | Wong |
| 7,791,387 B1 | 9/2010 | Wong |
| 8,508,399 B2 | 8/2013 | Lee et al. |
| 9,813,076 B1 | 11/2017 | Koifman et al. |

(Continued)

*Primary Examiner* — Peguy Jean Pierre
(74) *Attorney, Agent, or Firm* — Kligler & Associates Patent Attorneys Ltd

(57) ABSTRACT

An analog to digital converter (ADC) receives first and second analog input signals. A charge sampling demultiplexer includes multiple capacitors that sample the first and second analog input signals, and generates multiple input samples representative of charge stored on the capacitors. A plurality of sub-ADCs each include first and second charge-to-time converters, which receive from the charge sampling demultiplexer respective first and second input sample of the first and second analog input signals and output respective first and second pulse-width-modulated (PWM) signals responsively to the respective first and second input samples. Temporal processing circuitry processes the PWM signals to generate a digital value indicative of a temporal difference between the first and second PWM signals. Output reordering circuitry receives the digital value from each of the sub-ADCs and generates a digital output indicative of a difference between the first and second analog input signals.

12 Claims, 8 Drawing Sheets

(56) References Cited

U.S. PATENT DOCUMENTS

| | | |
|---|---|---|
| 10,419,013 B2 | 9/2019 | Koifman et al. |
| 10,536,158 B2 | 1/2020 | Galambos et al. |
| 2002/0097176 A1 | 7/2002 | Herbold |
| 2009/0256601 A1 | 10/2009 | Zhang et al. |
| 2020/0162068 A1* | 5/2020 | Best ................... H04L 25/4902 |

* cited by examiner

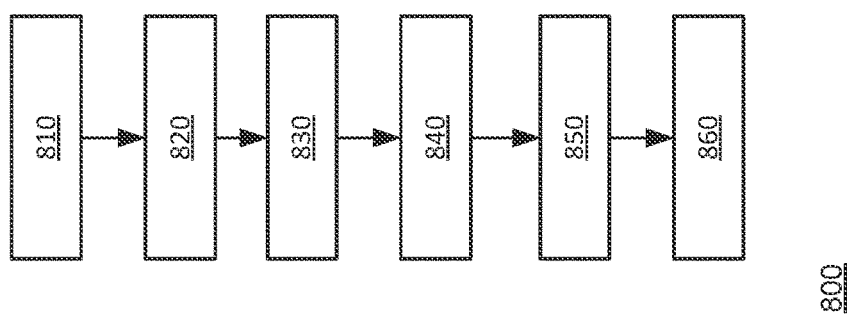

ANALOG TO DIGITAL CONVERTER AND A METHOD FOR ANALOG TO DIGITAL CONVERSION

CROSS-REFERENCE TO RELATED APPLICATION

This application is a continuation of U.S. patent application Ser. No. 17/302,588, filed May 6, 2021, which is incorporated herein by reference.

BACKGROUND

Analog to digital converter convert analog signals to digital signals.

There is a growing need to provide a highly accurate and efficient analog to digital converter.

SUMMARY

According to an embodiment of the invention there may be provided

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 8 illustrates an example of a method.

DETAILED DESCRIPTION OF THE DRAWINGS

Figure 1:
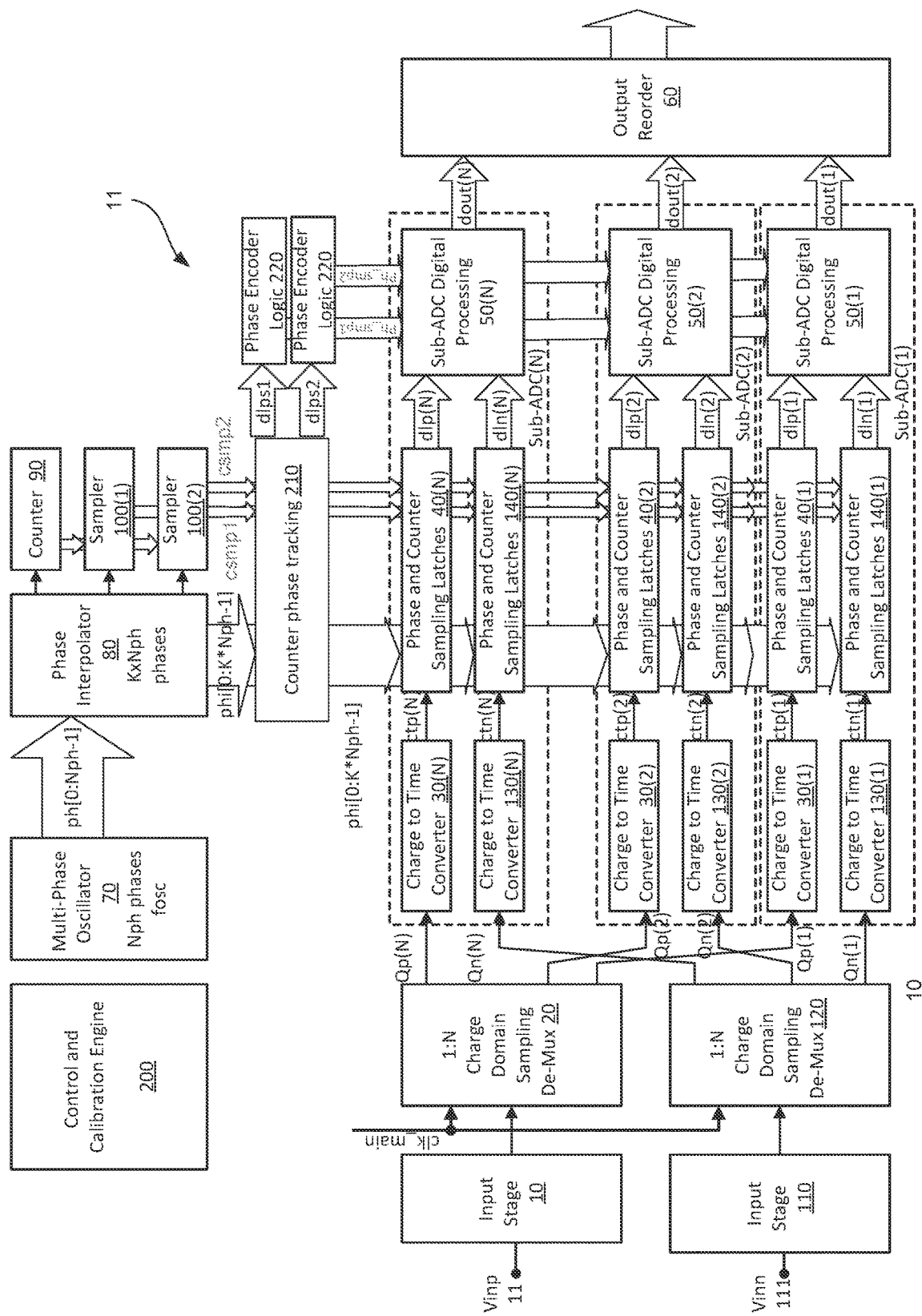
FIG. 1 illustrates an example of an analog to digital converter.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

ADC is an analog to digital converter.

De-Mux is a de-multiplexor.

N—a positive integer that exceeds 1 and may exceed 30, 120 and the like.

PWM—Pulse width modulation. PWM is a modulation scheme that converts an input signal to an output pulse. The width of the pulse represents the value of the input signal.

PWM Mod—PWM modulator.

There may be provided an ADC that may include an input, a signal generator and a processing unit.

The input may be configured to receive a first signal and a second signal (the difference between the first signal and the second signal is a value of a differential input signal.

The signal generator may be is configured to generate multiple signals, the multiple signals comprises a phase-shifted clock signals that are phase shifted from each other, first pulse width modulation (PWM) related signals indicative of a value of the first signal, second PWM related signals indicative of a value of the second signals, a first sampled stream, a second stream that have substantially opposite phases, and phase related signals related to the first sampled stream and the second sampled stream; wherein the first sampled stream and the second sampled stream are generated based on at least one of the phase shifted clock signals.

The processing unit may be configured to (i) receive at least some of the multiple signals, the at least some of the multiple signals comprises the first PWM related signals, the second PWM related signals, and the phase related signals; (ii) generate, based on the at least some of the multiple samples, virtual counter values and virtual phase values that are mutually aligned; (iii) determine a value of a difference between the first signal and the second signal, and (iv) output an ADC output signal indicative of the difference between the first signal and the second signal.

The processing unit may be configured to determine a value of the difference by applying a linear operation. This greatly simplifies the determination and reduces memory and computational resource consumption. The linear operation may not involve a modulo operation.

The signal generator may include a counter that is configured to be fed by a clock-associated phase-shifted clock signal of the multiple phase-shifted clock signals, and to output a counter output.

The signal generator may also include one or more samplers that are configured to convert the counter output to the first sampled stream and the second sampled stream.

The signal generator may include one or more encoders for generating a first phase change signal and a second phase change signal that are indicative of a predefined phase change in each one of the first sampled stream and the second sampled stream, respectively; wherein the first phase change signal and the second phase change signal belong to the phase related signals The signal generator may include a first sampling latch (SL) that is configured to (a) receive a first PWM pulse, the first PWM pulse is indicative of the first signal, (b) receive the phase-shifted clock signals that are phase shifted from each other, (c) output a first end signal indicative of a value of the first sampled counter output at an end of the first PWM pulse, (d) output a second end signal indicative of a value of the second sampled counter output at the end of the first PWM pulse; and (e) output a third end signal indicative of values of the phase-shifted clock signals at the end of the first PWM pulse. The first end signal, the second end signal and the third end signal belong to the first PWM related signals.

The signal generator may also include a second SL that is configured to (a) receive a second PWM pulse, the second PWM pulse is indicative of the second signal, (b) receive the phase-shifted clock signals that are phase shifted from each other, (c) output a fourth end signal indicative of a value of the first sampled counter output at an end of the second PWM pulse, (d) output a fifth end signal indicative of a value of the second sampled counter output at the end of the second PWM pulse, and (e) output a sixth end signal indicative of values of the phase-shifted clock signals at the end of the second PWM pulse; wherein the fourth end signal, the fifth end signal and the sixth end signal belong to the second PWM related signals.

The processing circuit may be configured to generate a first phase state signal and a second phase state signal, calculate first virtual phase value based on the first phase state signal, and calculate a second virtual phase value based on the second phase state signal.

The processing circuit may be configured to determine the value of the difference based on the first virtual phase value and on the second virtual phase value.

The processing circuit may be configured to select between the first end signal to the second end signal to provide a first selected end signal. The selection is very simple and accurate and simplifies the overall process or determining the value of the difference.

The processing circuit may be configured to select between the third end signal to the fourth end signal to provide a second selected end signal; determine a first virtual counter value based on the first selected end signal; and determine a second virtual counter value based on the second selected end signal.

FIG. 1 illustrates an example of an ADC. The ADC may include a control and calibration engine 200, an output reorder unit 60, a multi-phase oscillator 70, a phase interpolator 80, a counter 90, two samplers 100 (1) and 100 (2), a counter phase tracking unit 210, two phase encoder logic units 220, an input that include a first input stage 10 for receiving first signal Vinp 11, a second input stage 11 for receiving a second signal Vinn 111. The difference between Vinp and Vinn is the value of a differential input signal.

The multi-phase oscillator 70, phase interpolator 80, counter 90, two samplers 100 (1) and 100 (2), counter phase tracking unit 210, two phase encoder logic units 220 may form a signal generator 11.

The first input stage is followed by a first sampling de-mux circuit 20, the second input stage is followed by a second sampling de-mux circuit 120 (both de-mux circuits are denoted "1:N Charge Domain Sampling De-Mux") that creates one or more input samples for which the signal information of each sample is represented by the electrical charge stored on a capacitor of the sampling de-mux circuits.

The first and second de-mux circuits are followed by multiple (N) sub-ADC units denoted SUB-ADC(1)- Sub-ADC(N) that output N signals to output reorder unit 60. Each sub-ADC unit receives the output of the first sampling de-mux circuit and of the output of the second sampling de-mux circuit.

Each sub-ADC unit includes a first charge to time converter 30($n$) that is fed by the first sampling de-mux) 20, a first phase and counter sampling latches 40($n$) that is fed by the first charge to time converter, a second charge to time converter 130($n$) that is fed by the second sampling de-mux) 120, a second phase and counter sampling latches 140($n$) that is fed by the second charge to time converter 130($n$), a processing unit such as a sub-ADC Digital Processing 50($n$)—that receives the outputs of the first and second phase and counter sampling latches.

The first and second charge to time converters are configured to convert the charge stored in the first and second sampling de-muxes (respectively) to time domain information—for example by PWM modulation.

Digitization occurs in time domain using a set of k*Nph interpolated clock phases generated by multi-phase oscillator (70) and interpolator (80) for the fine bits and using a counter (90) that is re-sampled on complementary clock phases (substantially antiphase) (100(1:2)).

The processing unit of each sub-ADC unit are configured to tracking after phase on which each of the re-sampled counter bits transition in order to avoid using data affected by metastability. If the phase difference between the two samples of the counter is kept accurate enough, it is sufficient to track only one of them and assume the second one exactly in antiphase.

Reorder unit 60 (may be a processor such as but not limited to logic state machine) may processes the outputs of sub-ADC digital processing circuits 50(1)-50(N) to provide an output ADC signal. Re-order unit 60 may be configured to re-order the digital outputs and can also do tasks related to calibration that are done in the digital domain.

The ADC also may include a control and calibration engine 200 that is arranged to calibrate the different analog circuits—for example to equalize the offsets, gains and bandwidths and any other parameters of the different charge memory cells and/or of the charge to time convertors—or any other circuit of the ADC.

Figure 2:
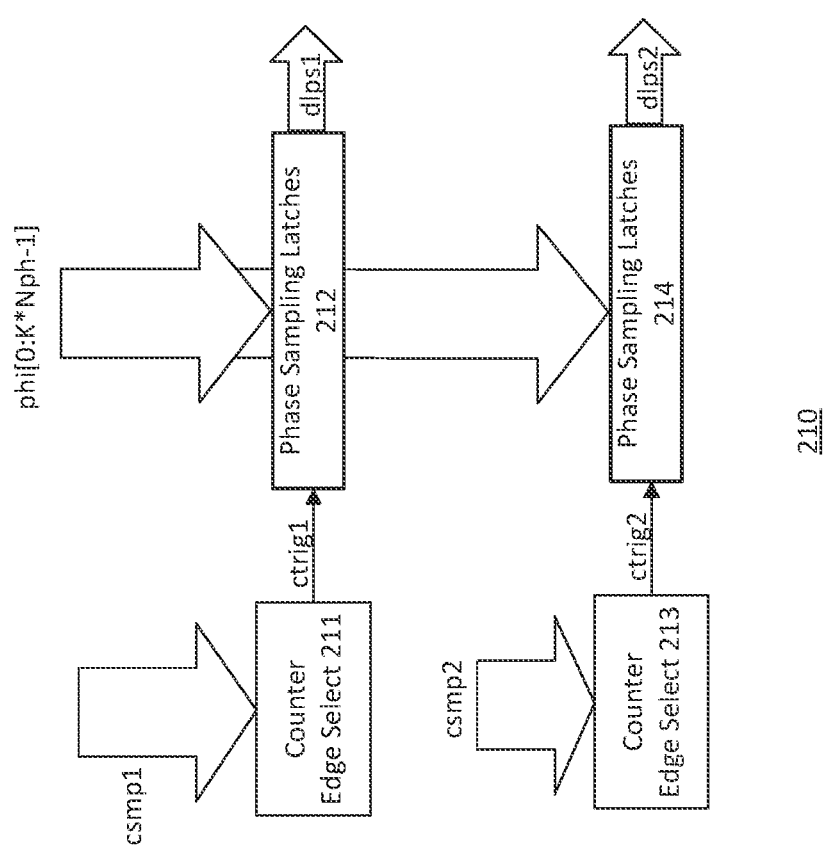
FIG. 2 illustrates an example of a counter phase tracking unit of the analog to digital converter of FIG. 1.

An example of the counter phase tracking circuit 210 is shown in FIG. 2. Phase sampling latches 212 and 214 are driven by the ctrig signal that is generated by a counter edge select units 211 and 213 respectively that process the outputs (e1 and csmp2) of the two samplers 100 (1) and 100(2). Each counter edge select unit may be is a combinatorial logic that creates a pulse in line with the transitions of the counter, for example csmp1=—for example—generating a pulse per counter wrap-around cycle.

An example of a table that shows the operation of a phase encoder is illustrated below:

| Encoder Table for K*Nph = 16 | | | | | | | | |
|---|---|---|---|---|---|---|---|---|
| lphi [0] | lphi [1] | lphi [2] | lphi [3] | lphi [4] | lphi [5] | lphi [6] | lphi [7] | phase |
| 0 | 0 | 0 | 0 | 0 | 0 | 0 | 0 | 0 |
| 1 | 0 | 0 | 0 | 0 | 0 | 0 | 0 | 1 |
| 1 | 1 | 0 | 0 | 0 | 0 | 0 | 0 | 2 |
| 1 | 1 | 1 | 0 | 0 | 0 | 0 | 0 | 3 |
| 1 | 1 | 1 | 1 | 0 | 0 | 0 | 0 | 4 |
| 1 | 1 | 1 | 1 | 1 | 0 | 0 | 0 | 5 |
| 1 | 1 | 1 | 1 | 1 | 1 | 0 | 0 | 6 |
| 1 | 1 | 1 | 1 | 1 | 1 | 1 | 0 | 7 |
| 1 | 1 | 1 | 1 | 1 | 1 | 1 | 1 | 8 |
| 0 | 1 | 1 | 1 | 1 | 1 | 1 | 1 | 9 |
| 0 | 0 | 1 | 1 | 1 | 1 | 1 | 1 | 10 |
| 0 | 0 | 0 | 1 | 1 | 1 | 1 | 1 | 11 |
| 0 | 0 | 0 | 0 | 1 | 1 | 1 | 1 | 12 |
| 0 | 0 | 0 | 0 | 0 | 1 | 1 | 1 | 13 |
| 0 | 0 | 0 | 0 | 0 | 0 | 1 | 1 | 14 |
| 0 | 0 | 0 | 0 | 0 | 0 | 0 | 1 | 15 |

Figure 3:
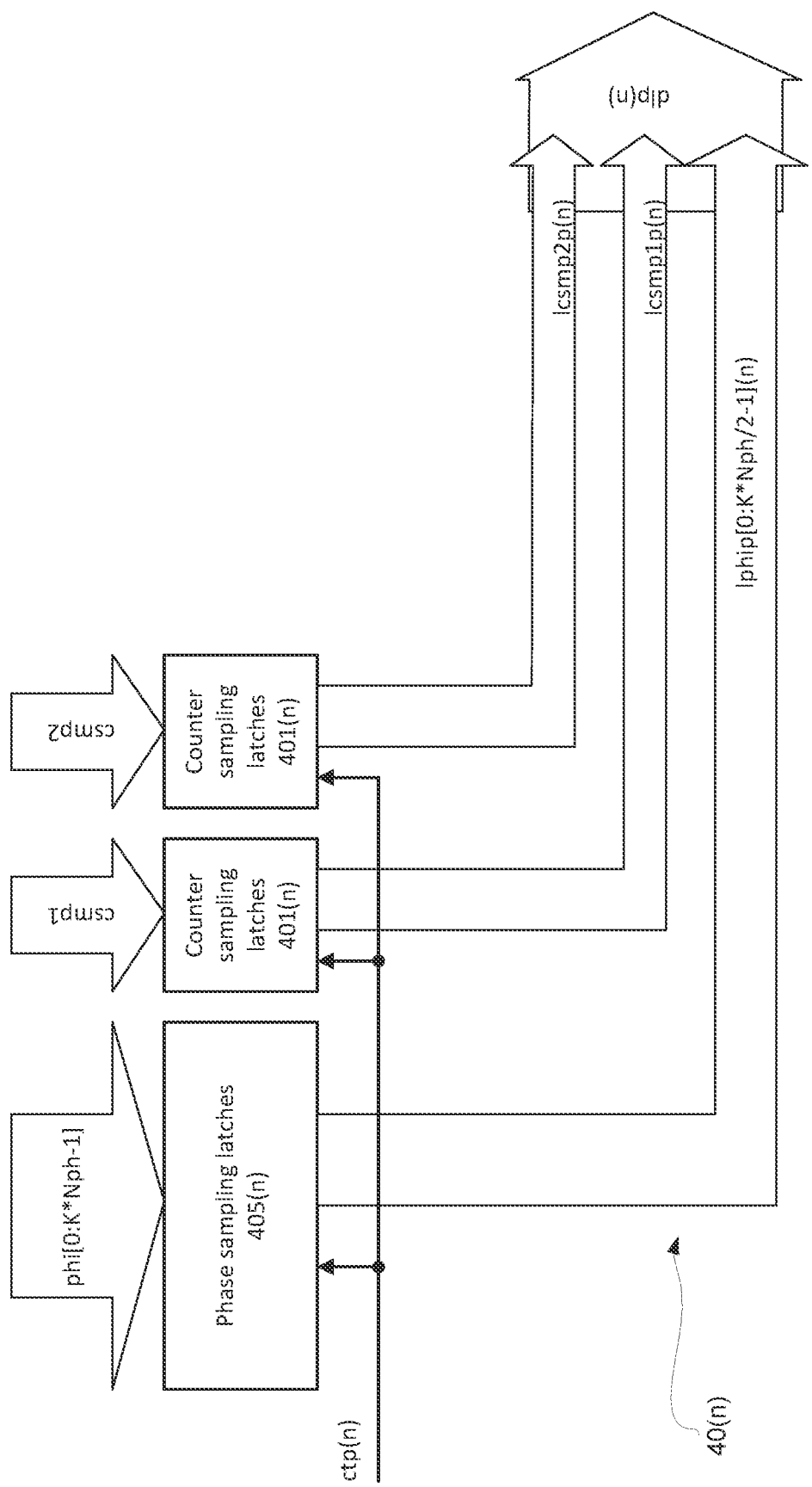
FIG. 3 illustrates an example of a phase and counter sampling latches of the analog to digital converter of FIG. 1.

An n'th phase and counter sampling latch 40(*n*) is shown in FIG. 3. The phase-shifted clock signals that are phase shifted from each other are provided to phase sampling latches 405(*n*) that output the values of the phase shifted clock signals at a predefined time—for example an end of a PWM pulse. The two sampled counter streams are presented respectively to counter sampling latches 401(*n*) that output the values of the sampled counter streams at a predefined time—for example an end of a PWM pulse.

Figure 4:
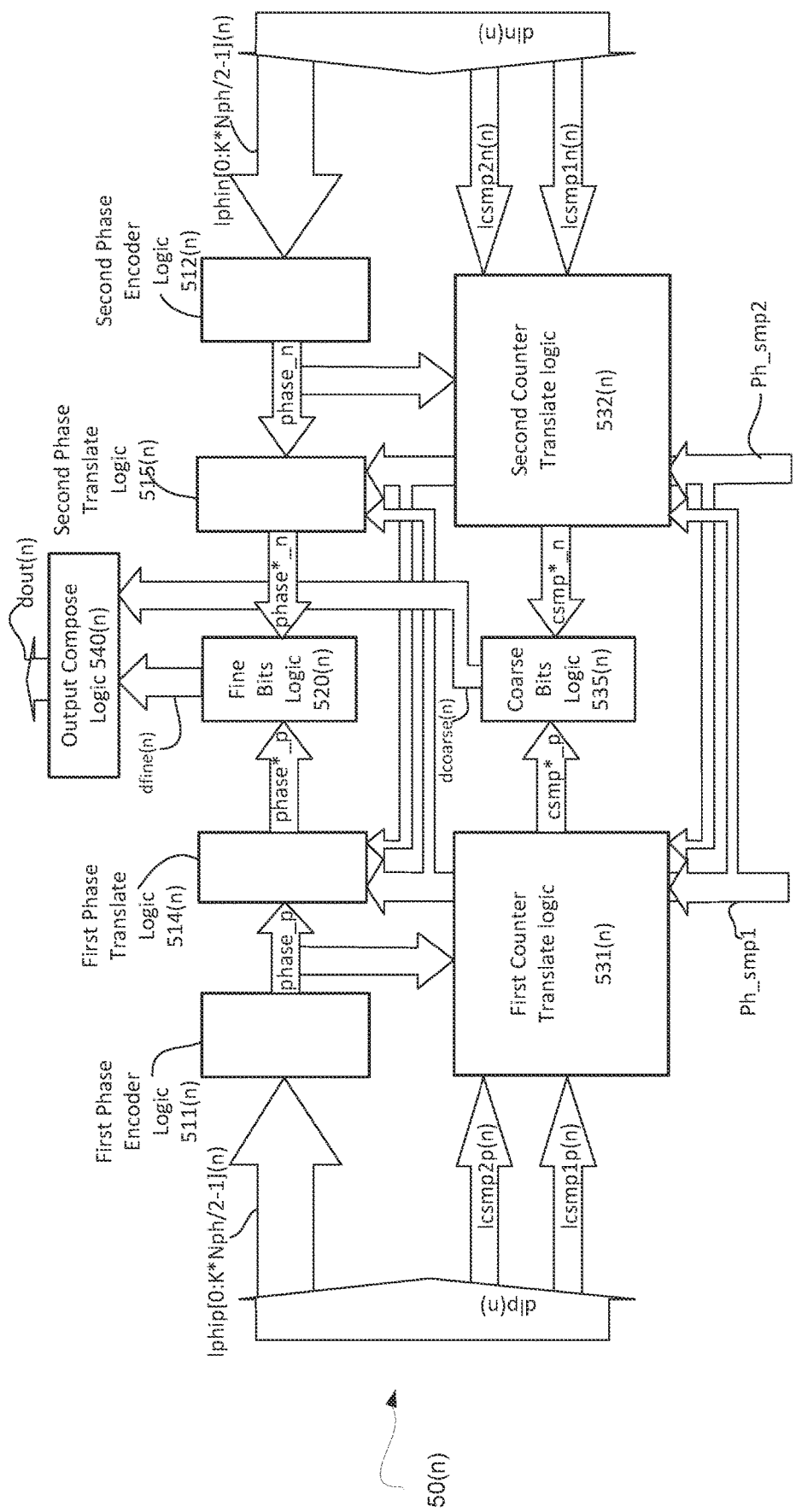
FIG. 4 illustrates an example of a processing unit such as a sub-ADC digital processing unit of the analog to digital converter of FIG. 1.

The block schematics of the sub_ADC processing block (50(1:N)) is shown in FIG. 4. It includes fine bits logic 520(*n*), coarse bits logic 535(*n*), first counter translate logic 531(*n*), second counter translate logic 532(*n*), first phase encoder logic 511(*n*), second phase encode logic 512(*n*), first phase translate logic 514(*n*), second phase translate logic 515(*n*), and output compose logic 540(*n*). The operations performed will be explained below.

a. Each one of first and second phase translation logics calculate the following equation: $ph^*[x]=(phi[x]-(Ph\_smp1+Ph\_smp2)/2)Mod_{K^*Nph}$
b. The fine bits logic calculates the following equation: $dfine=(phase^*\_p-phase^*\_n)$.
c. The coarse bits logic calculates the following equation $dcoarse=csmp\_p^*-csmp\_n^*$.
d. The first counter translate logic performs the following selection:
$csmp^*\_p(n)=lcsmp1\_p(n)$ if $(phase\_p(n)-(Ph\_smp1+Ph\_smp2)/2)Mod_{K^*Nph}<K^*Nph/2$
$csmp^*\_p(n)=lcsmp2\_p(n)$ if $(phase\_p(n)-(Ph\_smp1+Ph\_smp2)/2)Mod_{K^*Nph}\geq K^*Nph/$
e. The second counter translate logic performs the following selection:
$csmp^*\_n(n)=lcsmp1\_n(n)$ if $(phase\_n(n)-(Ph\_smp1+Ph\_smp2)/2)Mod_{K^*Nph}<K^*Nph/2$
$csmp^*\_n(n)=lcsmp2\_n(n)$ if $(phase\_n(n)-(Ph\_smp1+Ph\_smp2)/2)Mod_{K^*Nph}\geq K^*Nph/2$ The output unit calculates the following equation: $dout=K^*Nph^*dcoarse+dfine$.

The task each sub-ADC unit is to measure the time difference between two events denoted by edges of the signals ctp and ctn. This operation is done by creating a time reference similar to a measuring tape on which the fine divisions are represented by the clock phases and the coarse divisions re represented by the counter. The way this time reference is constructed is described in FIG. 5.

Figure 6:
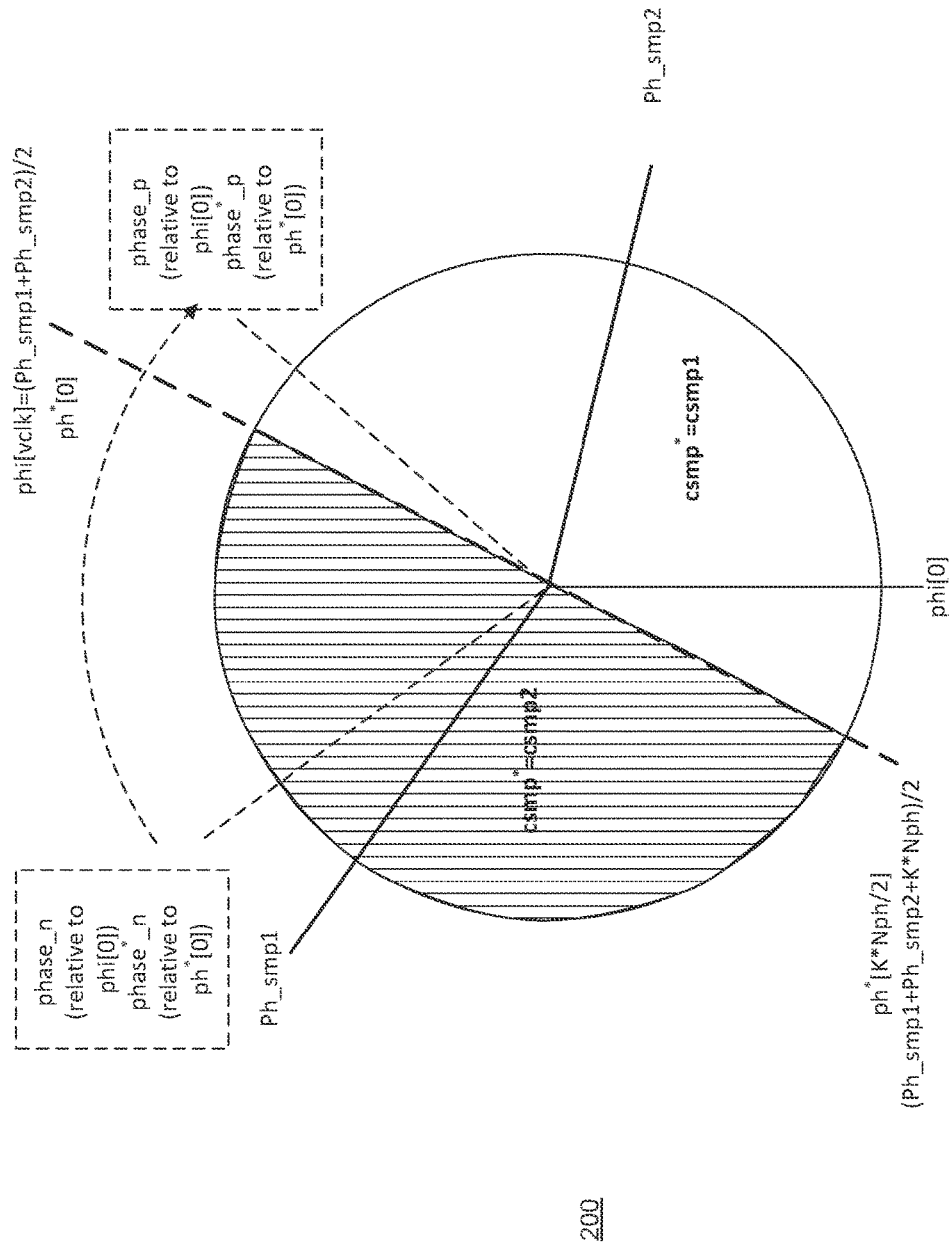
FIG. 6 illustrates examples of various clock phases and decisions related to the various clock phases.

FIG. 6 illustrates the selection made by the first counter translate logic. In this figure the phase difference between Ph_smp1 and Ph_smp2 are about pi. The dashed line is the threshold for selecting the between csmp1_p(n) and csmp2_p(n).

Looking at each of the codes of the counter (90) for example code i-2, when re-sampled as csmp1 (100(1)) and csmp2 (100(2)) they span a time interval of about 1.5 clock cycles.

The processing unit may choose one of the phases phi [vclk] as the origin of the virtual counter csmp* and also as the origin of the set of virtual phases ph*[0].

In this way, the virtual counter and virtual phases are always aligned so that the time measurement operation can be done in a simple linear domain without need of complicated modulo operations.

The virtual counter csmp* is generated by choosing between csmp1 and csmp2 (or rather the sampled values of counters lcsmp1p and lcampsp) based on phase information. The choice of phi[vclk] has to be done so as to maximize the margins for avoiding the use metastable samples of the counter. These four margins are shown explicitly in FIG. 5.

Figure 5:
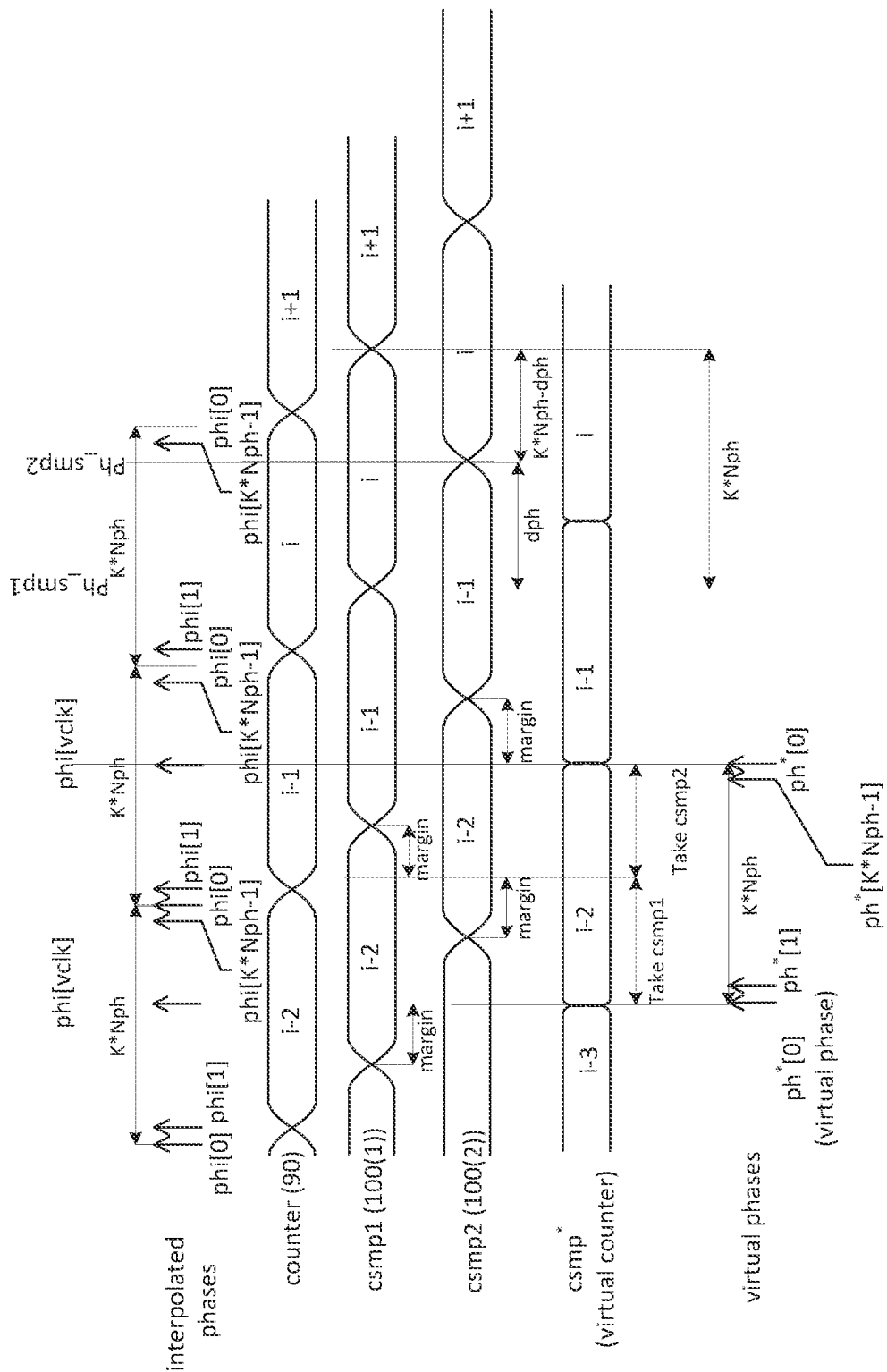
FIG. 5 illustrates an example of a timing diagram of signals generated by circuits of an analog to digital converter.

The timing diagram and the phase domain representation are illustrated in FIGS. 5 and 6, respectively.

The phases on which the two samplings of the counter transition are Ph_smp1 and Ph_smp2. In order to maximize the safety margins, the phase on which the virtual counter csmp* changes ph[vclk] is chosen so as to coincide with the bisector of the angle between Ph_smp1-1 and Ph_smp2. The virtual counter is then built by choosing csmpl in the white half circle and csmp2 in the hashed half circle. This can be described by the following equations.

The suggested method may include building a virtual ruler consisting of the virtual counter csmp* and the virtual phases ph*[x] (where x=0:K*Nph)

Choice of virtual phases (formula to calculate virtual phase ph* from actual sampled interpolated phase phi) is done by phase translate block 515: $ph^*[x]=(phi[x]-(Ph\_smp1+Ph\_smp2)/2)Mod_{K^*Nph}$ The processing unit calculates the virtual phase phase*_p and phase*_n for both samples phase_p and phase_n Building the virtual counter (formula to calculate the virtual csmp* counter from the latched values of the 2 sampled counters lcsmp1 and lcsmp2 and the phases phase_p and phase_n(block 530)):
$csmp^*\_p(n)=lcsmp1\_p(n)$ if $(phase\_p(n)-(Ph\_smp1+Ph\_smp2)/2)Mod_{K^*Nph}<K^*Nph/2$
$csmp^*\_p(n)=lcsmp2\_p(n)$ if $(phase\_p(n)-(Ph\_smp1+Ph\_smp2)/2)Mod_{K^*Nph}\geq K^*Nph/2$
$csmp^*\_n(n)=lcsmp1\_n(n)$ if $(phase\_n(n)-(Ph\_smp1+Ph\_smp2)/2)Mod_{K^*Nph}<K^*Nph/2$
$csmp^*\_n(n)=lcsmp2\_n(n)$ if $(phase\_n(n)-(Ph\_smp1+Ph\_smp2)/2)Mod_{K^*Nph}\geq K^*Nph/2$ Calculate fine bits (block 520): $D\_fine=(phase^*\_p-phase^*\_n)$
Note that this difference is signed (meaning it can be negative).

Calculate coarse bits (inside block 530): $D\_coarse=csmp\_p^*-csmp\_n^*$
Note that this difference is signed (meaning it can be negative).

Figure 7:
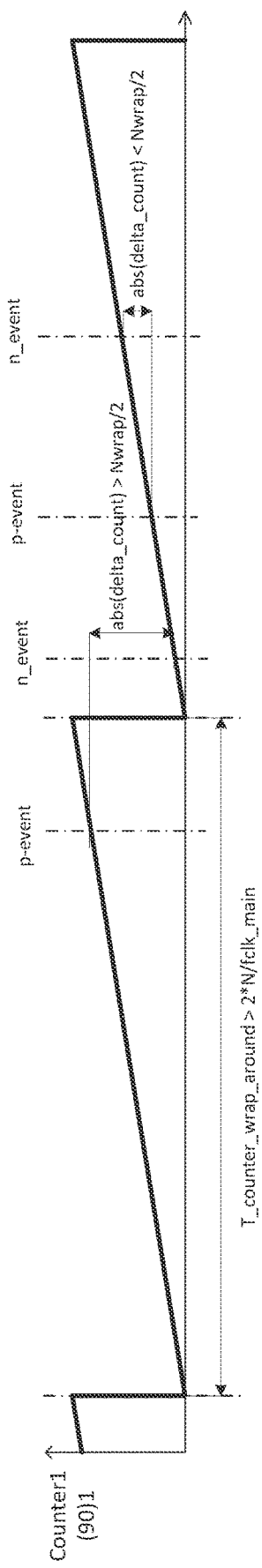
FIG. 7 illustrates an example of a timing diagram of signals generated by circuits of an analog to digital converter of FIG. 1.

Combine fine and coarse bits for final digital output (block 540): $dout=K^*Nph^*D\_coarse+Dfine$ As shown in FIG. 7, if the maximum time difference to be measured is less than half the wrap-around time of the counter, the counter wrap-around correction only consists in disregarding the MSB of the counter.

FIG. 8 illustrates method 800 for analog to digital conversion.

Method 800 may start by step 810 of receiving, by an input, a first signal and a second signal.

Step 810 may be followed by step 820 of generating multiple signals by a signal generator, the multiple signals may include a phase-shifted clock signals that are phase shifted from each other, first pulse width modulation (PWM) related signals (for the first, second, and third end signals) indicative of a value of the first signal, second PWM related signals indicative of a value of the second signal (for example—the fourth, fifth and sixth end signals), a first sampled stream (csmp1), a second stream (csmp2) that have substantially opposite phases, and phase related signals (for example ph_smp 1 and ph_smp2) related to the first sampled stream and the second sampled stream. The first sampled stream and the second sampled stream are generated based on at least one of the phase shifted clock signals.

Step 820 may be followed by step 830 of receiving, by a processing unit, at least some of the multiple signals, the at least some of the multiple signals comprises the first PWM related signals, the second PWM related signals, and the phase related signals.

Step 830 may be followed by step 840 of generating, based on the at least some of the multiple samples, virtual counter values and virtual phase values that are mutually aligned.

Step 840 may be followed by step 850 of determining a value of a difference between the first signal and the second signal.

Step 850 may be followed by step 860 of outputting an ADC output signal indicative of the difference between the first signal and the second signal.

Step 850 may include applying a linear operation—and may avoid performing a modulo operation.

The signal generator may include a counter and step 820 may include receiving by the counter a clock-associated phase-shifted clock signal of the multiple phase-shifted clock signals, and to outputting by the counter a counter output.

The signal generator may include one or more samplers and step 820 may include converting, by the one or more samplers, the counter output to the first sampled stream and the second sampled stream.

The signal generator may include one or more encoders, and step 820 may include generating, by the one or more encoders, a first phase change signal and a second phase change signal that are indicative of a predefined phase change in each one of the first sampled stream and the second sampled stream, respectively; wherein the first phase change signal and the second phase change signal belong to the phase related signals.

The signal generator may include a first sampling latch (SL), and step 820 include (a) receiving, by the first SL, a first PWM pulse, the first PWM pulse is indicative of the first signal, (b) receiving, by the first SL, the phase-shifted clock signals that are phase shifted from each other, (c) outputting, by the first SL, a first end signal indicative of a value of the first sampled counter output at an end of the first PWM pulse, (d) outputting, by the first SL, a second end signal indicative of a value of the first sampled counter output at the end of the first PWM pulse; and (e) outputting, by the first SL, a third end signal indicative of values of the phase-shifted clock signals at the end of the first PWM pulse; wherein the first end signal, the second end signal and the third end signal belong to the first PWM related signals.

The signal generator may include a second SL, and step 820 may include (a) receiving, by the second SL, a second PWM pulse, the second PWM pulse is indicative of the second signal, (b) receiving, by the second SL, the phase-shifted clock signals that are phase shifted from each other, (c) outputting, by the second SL, a fourth end signal indicative of a value of the second sampled counter output at an end of the second PWM pulse, (d) outputting, by the second SL, a fifth end signal indicative of a value of the second sampled counter output at the end of the second PWM pulse, and (e) outputting, by the second SL, a sixth end signal indicative of values of the phase-shifted clock signals at the end of the second PWM pulse; wherein the fourth end signal, the fifth end signal and the sixth end signal belong to the second PWM related signals.

Step 840 may include generating, by the processing circuit, a first phase state signal and a second phase state signal (for example phase*_p and phase*_n), calculating first virtual phase value based on the first phase state signal, and calculating a second virtual phase value based on the second phase state signal.

Step 850 may include determining, by the processing circuit, the value of the difference based on the first virtual phase value and on the second virtual phase value.

Step 850 may include selecting, by the processing circuit, between the first end signal to the second end signal (Icsmp2p(n) and Icsmp1p(n)) to provide a first selected end signal (csmp*_p(n)); selecting between the third end signal to the fourth end signal (Icsmp2n(n) and Icsmpin(n)) to provide a second selected end signal (csmp*n(n)); determining a first virtual counter value based on the first selected end signal; and determining a second virtual counter value based on the second selected end signal.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above-described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Any reference to any of the terms "comprise", "may include", "comprising" "including", "may include" and "includes" may be applied to any of the terms "consists", "consisting", "consisting essentially of". For example—any of the circuits illustrated in any figure may include more components that those illustrated in the figure, only the components illustrated in the figure or substantially only the components illustrate din the figure.

Also for example, in one embodiment, the illustrated examples may be implemented as circuitry located on a single integrated circuit. Alternatively, the examples may be implemented as any number of separate integrated circuits or separate common mode noise chokes interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. An analog to digital converter (ADC), comprising:
an input stage configured to receive first and second analog input signals;
a charge sampling demultiplexer, which comprises multiple capacitors that are coupled to sample the first and second analog input signals, and which is configured to generate multiple input samples representative of charge stored on the capacitors;
a plurality of sub-ADCs, each sub-ADC comprising:
first and second charge-to-time converters, which are coupled to receive from the charge sampling demultiplexer a respective first input sample of the first analog input signal and a respective second input sample of the second analog input signal and to output respective first and second pulse-width-modulated (PWM) signals responsively to the respective first and second input samples; and
temporal processing circuitry, which is coupled to process the PWM signals to generate a digital value indicative of a temporal difference between the first and second PWM signals; and
output reordering circuitry, which is coupled to receive the digital value from each of the sub-ADCs and to generate a digital output indicative of a difference between the first and second analog input signals.

2. The ADC according to claim 1, wherein the temporal processing circuitry comprises multiple sampling latches, which are configured to detect a phase difference between the first and second PWM signals, and a digital processing block, which is configured to generate the digital value responsively to the phase difference.

3. The ADC according to claim 2, and comprising a counter phase tracking circuit, which is configured to generate multiple phase-shifted clock signals that are phase shifted from one another other, wherein the sampling latches are configured to detect the phase difference using the multiple phase-shifted clock signals.

4. The ADC according to claim 3, wherein the counter phase tracking circuit is further configured to generate multiple counter sampling signals, and wherein the multiple sampling latches comprise phase sampling latches, which are configured to detect a first phase difference value between the first and second PWM signals responsively to the phase-shifted clock signals, and counter sampling latches, which are configured to detect a second phase difference value between the first and second PWM signals responsively to the counter sampling signals, and
wherein the digital processing block is configured to generate the digital value responsively to the first and second phase difference values.

5. The ADC according to claim 4, wherein the counter sampling latches are configured to output, responsively to the counter sampling signals, a first counter value indicative of a first edge of a first pulse in the first PWM signal and a second counter value indicative of a second edge of a second pulse in the second PWM signal.

6. The ADC according to claim 2, wherein the digital processing block is configured to generate the digital value by applying a linear operation to the detected phase difference.

7. A method for analog to digital conversion, comprising:
receiving first and second analog input signals;
sampling the first and second analog input signals in a charge sampling demultiplexer, which comprises multiple capacitors that are coupled to sample the first and second analog input signals, and generates multiple input samples representative of charge stored on the capacitors;
digitizing the input samples to a plurality of sub-ADCs, each sub-ADC comprising:
first and second charge-to-time converters, which are coupled to receive from the charge sampling demultiplexer a respective first input sample of the first analog input signal and a respective second input sample of the second analog input signal and to output respective first and second pulse-width-modulated (PWM) signals responsively to the respective first and second input samples; and
temporal processing circuitry, which is coupled to process the PWM signals to generate a digital value indicative of a temporal difference between the first and second PWM signals; and generating a digital output indicative of a difference between the first and second analog input signals using the digital value generated by each of the sub-ADCs.

8. The method according to claim 7, wherein the temporal processing circuitry comprises multiple sampling latches, which detect a phase difference between the first and second PWM signals, and a digital processing block, which generates the digital value responsively to the phase difference.

9. The method according to claim 8, and comprising generating multiple phase-shifted clock signals that are phase shifted from one another other, wherein the sampling latches detect the phase difference using the multiple phase-shifted clock signals.

10. The method according to claim 9, and comprising generating multiple counter sampling signals, wherein the multiple sampling latches comprise phase sampling latches, which detect a first phase difference value between the first and second PWM signals responsively to the phase-shifted clock signals, and counter sampling latches, which detect a second phase difference value between the first and second PWM signals responsively to the counter sampling signals, and wherein the digital processing block generates the digital value responsively to the first and second phase difference values.

11. The method according to claim 10, wherein the counter sampling latches output, responsively to the counter sampling signals, a first counter value indicative of a first edge of a first pulse in the first PWM signal and a second counter value indicative of a second edge of a second pulse in the second PWM signal.

12. The method according to claim 8, wherein the digital processing block generates the digital value by applying a linear operation to the detected phase difference.

* * * * *